United States Patent [19]
Chapman et al.

[11] Patent Number: 5,581,084
[45] Date of Patent: Dec. 3, 1996

[54] SIMULTANEOUS TWO COLOR IR DETECTOR HAVING COMMON MIDDLE LAYER METALLIC CONTACT

[75] Inventors: George R. Chapman, Santa Barbara; Bonnie A. Baumgratz; Michael Ray, both of Goleta, all of Calif.

[73] Assignee: Santa Barbara Research Center, Goleta, Calif.

[21] Appl. No.: 486,491

[22] Filed: Jun. 7, 1995

[51] Int. Cl.$^6$ .................................................. G01J 1/00
[52] U.S. Cl. ............................ 250/338.4; 250/370.06; 250/370.08; 250/332; 250/339.02
[58] Field of Search ...................... 250/338.4, 370.06, 250/339.02, 370.08, 332, 349

[56] References Cited

U.S. PATENT DOCUMENTS

| | | | |
|---|---|---|---|
| 4,224,520 | 9/1980 | Greene et al. | 250/338.4 |
| 4,753,684 | 6/1988 | Ondris et al. | 136/258 |
| 4,847,489 | 7/1989 | Deitrich | 250/226 |
| 4,885,619 | 12/1989 | Kosai | 357/24 |
| 5,113,076 | 5/1992 | Schulte | 250/370 |
| 5,149,956 | 9/1992 | Norton | 250/211 |

FOREIGN PATENT DOCUMENTS 55-101832  8/1980  Japan.

OTHER PUBLICATIONS

J. M. Pawlikowski and P. Becla, "Some Properties of Photovoltaic $Cd_xHq_{1-x}Te$ Detectors for Infrared Radiation", Infrared Physics, vol. 15, (1975) pp. 331–337.

Journal of Crystal Growth 86 (1988) 161–172, North–Holland, Amsterdam–"Infinite–Melt Vertical Liquid–Phase Epitaxy of HgCdTe From Hg Solution: Status and Prospects"–Tse Tung.

Wilfrid B. Veldkamp and Thomas J. McHugh–"Binary Optics"–Scientific American, May, 1992, pp. 91–97.

Report No. SD–TR–87–54, W. A. Garber, E. F. Cross, O. L. Gibb, G. D. Wiemolky and I. J. Spiro–"Optical Technique for Increasing Fill Factor of Mosaic Arrays"–Nov. 10, 1987.

J. M. Arias, M. Zandian, G. M. Williams, E. R. Blazejewski, R. E. DeWames and J. G. Pasko–"HgCdTe dual–band infrared photodiodes grown by molecular beam epitaxy"–J.Appl. Phys. 70 (8), Oct. 15, 1991.

*Primary Examiner*—Davis L. Willis
*Assistant Examiner*—Kiet T. Nguyen
*Attorney, Agent, or Firm*—W. C. Schubert; W. K. Denson-Low

[57] ABSTRACT

An array of dual-band HgCdTe radiation detectors (10) wherein individual detectors include a first layer (14) having a first type of electrical conductivity and a bandgap selected for absorbing radiation within a first spectral band. The radiation detectors also each include a second layer (16) overlying the first layer. The second layer has a second type of electrical conductivity that is opposite the first type of electrical conductivity. Each radiation detector further includes a third layer (18) overlying the second layer, the third layer having the first type of electrical conductivity and a bandgap selected for absorbing radiation within a second spectral band. The first and second spectral bands are selected from SWIR, MWIR, LWIR, and VLWIR. The first, second and third layers are contained within at least one mesa structure (10a, 10b) that supports on a top surface thereof a first electrical contact (24) to the first layer and a second electrical contact (28) to the third layer. The at least one mesa structure further supports on a sidewall region (10b') thereof an electrical contact (30) to the second layer. The sidewall electrical contact is coupled to an electrically conductive bus that is conductively coupled in common to mesa structure sidewall electrical contacts of the plurality of radiation detectors. As a result, each radiation detector site is simplified in construction, and may be reduced in area over a site wherein a separate (third) contact, such as an indium bump, is required to contact the second layer.

19 Claims, 3 Drawing Sheets

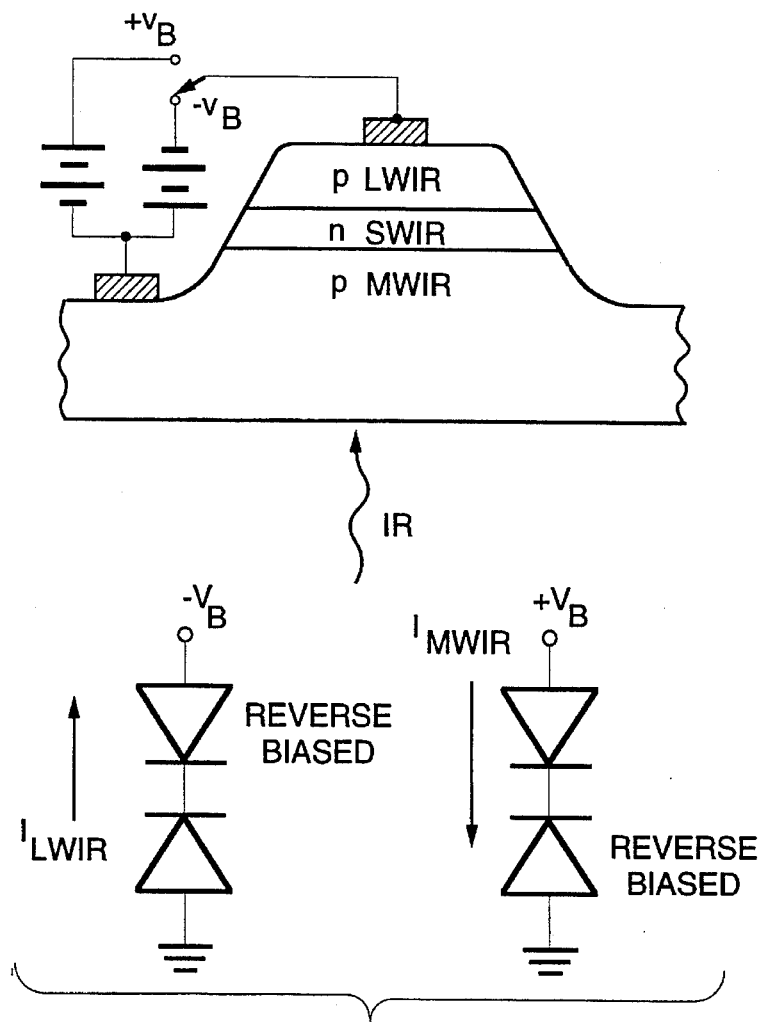
FIG. 1.
(PRIOR ART)
FIG. 2.
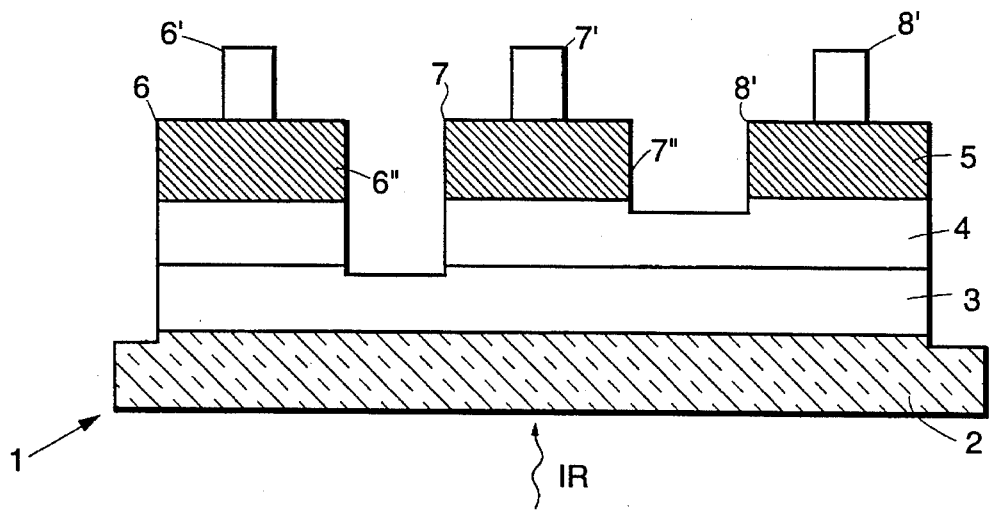

LENGTH (μm)

INCIDENT IR

SIMULTANEOUS TWO COLOR IR DETECTOR HAVING COMMON MIDDLE LAYER METALLIC CONTACT

FIELD OF THE INVENTION

This invention relates generally to solid state radiation detectors and, in particular, to radiation detectors that are sensitive to radiation within a plurality of spectral bands or "colors".

BACKGROUND OF THE INVENTION

A desirable type of photodetector is a two-color infrared radiation (IR) detector having simultaneous sensitivity in two spectral bands. The spectral bands may include short wavelength IR (SWIR), medium wavelength IR (MWIR), long wavelength IR (LWIR), and very long wavelength IR (VLWIR). An array of two-color IR detectors may be employed in a number of imaging applications wherein it is required to simultaneously detect radiation within two spectral bands from a scene within a field of view of the array. By example, the array may simultaneously detect LWIR and MWIR, or LWIR and SWIR.

Referring to FIG. 1, commonly assigned U.S. Pat. No. 5,113,076, issued May 12, 1992, entitled "Two Terminal Multiband Infrared Radiation Detector" to E. F. Schulte, discloses a radiation detector having two heterojunctions that function in a manner analogous to two back-to-back photodiodes. Each of the photodiodes is responsive to radiation within a different IR spectral band, such as LWIR and MWIR. Detection of a particular wavelength band is achieved by switching a bias supply. Disclosed configurations include an n-p-n configuration, a p-n-p configuration, and a p-n-p-n configuration.

Reference is also made to commonly assigned U.S. Pat. No. 5,149,956, issued Sep. 22, 1992, entitled "Two-Color Radiation Detector Array and Methods of Fabricating Same", by P. R. Norton. This patent describes the formation of a substantially continuous common layer between semiconductor regions responsive to different wavelength bands (e.g., MWIR and LWIR). A contact 28 is made to the common layer for coupling same to readout electronics.

Reference can also be made to the n-p+-n dual-band detector described by J. M. Arias et al. in the Journal of Applied Physics, 70(8), 15 Oct. 1991, pgs. 4820–4822. This triple-layer n-p+-n structure assumes that MWIR absorption occurs in the bottom n-type layer, and LWIR absorption in the top n-type layer.

In U.S. Pat. No. 4,847,489, Jul. 11, 1989, entitled "Light Sensitive Superlattice Detector Arrangement with Spectral Sensitivity" Dietrich discloses a detector arrangement comprising a plurality of photosensitive detector elements. Each of the detector elements has a multilayer structure of alternating positively and negatively doped photosensitive semiconductor material having a superlattice structure. A control voltage is said to control spectral light sensitivity, and an optical filter arrangement is provided for dividing the photodetectors into an upper and lower effective spectral range group.

In U.S. Pat. No 4,753,684, Jun. 28, 1988, "Photovoltaic Heterojunction Structures" Ondris et al. describe a three layer, double heterojunction Group II–VI photovoltaic structure.

In Japanese Patent No. 55-101832, Aug. 4, 1980, Makoto Itou discloses, in the Abstract, an infrared detector comprised of n-type HgCdTe having electrodes 2 and 3 arranged on opposite surfaces. A polarity of a bias voltage is switchably coupled to the electrodes 2 and 3. This device is said to enable rays of wide wavelength ranges to be detected by only one semiconductor detector.

General information regarding IR-responsive materials may be found in an article entitled "HgCdTe and Related Alloys" D. Long and J. L. Schmit, Semiconductors and Semimetals, Vol. 5, IR Detectors, Academic Press 1970.

An article entitled "Some Properties of Photovoltaic $Cd_xHg_{1-x}Te$ Detectors for Infrared Radiation", by J. M. Pawlikowski and P. Becla, Infrared Physics, Vol. 15 (1975) pp. 331–337 describes photovoltaic p-n junction detectors constructed of HgCdTe crystals and epitaxial films. The authors report that the position of a photosensitivity maximum is shifted within a spectral region of 1–9 microns by changing a molar fraction of cadmium.

Also of interest are commonly assigned U.S. patent application Ser. No. 08/014,939, filed Feb. 8, 1993, entitled "Method of Fabricating a Two Color Detector Using LPE Crystal Growth", by P. R. Norton (allowed); and commonly assigned U.S. patent application Ser. No. 08/045,741, filed Apr. 8, 1993, entitled "Dual-Band Infrared Radiation Detector Optimized for Fabrication in Compositionally Graded HgCdTe", by K. Kosai and G. Chapman

SUMMARY OF THE INVENTION

It is an object of this invention to provide an improved two color IR detector of reduced complexity over conventional approaches.

It is another object of this invention to provide a two color IR detector array having a common contact for each radiation detector or pixel of the array. The common contact takes the form of a bus that is threaded through the array for contacting a common layer within a mesa structure or structures of individual ones of the detectors. In this manner an associated readout device is enabled to contact a middle, common layer of each detector at a periphery of the array, as opposed to within each pixel.

The foregoing objects of the invention are realized by an array comprised of a plurality of radiation detectors, and by a method for fabricating the array. In a presently preferred embodiment individual ones of the radiation detectors include a first layer comprised of Group II–VI semiconductor material. The first layer has a first type of electrical conductivity and a bandgap selected for absorbing radiation within a first spectral band. The radiation detectors also each include a second layer overlying the first layer. The second layer is comprised of Group II–VI semiconductor material and has a second type of electrical conductivity that is opposite the first type of electrical conductivity. Each radiation detector further includes a third layer overlying the second layer, the third layer also being comprised of Group II–VI semiconductor material. The third layer has the first type of electrical conductivity and a bandgap selected for absorbing radiation within a second spectral band. The first and second spectral bands are selected from the group consisting essentially of SWIR, MWIR, LWIR, and VLWIR.

The first, second and third layers are contained within at least one mesa structure that supports on a top surface thereof a first electrical contact to the first layer and a second electrical contact to the third layer. The first electrical contact includes a first indium bump and the second electrical contact includes a second indium bump for coupling to an external readout integrated circuit.

In accordance with this invention the at least one mesa structure further supports on a sidewall thereof an electrical contact to the second layer. The sidewall electrical contact is coupled to an electrically conductive bus that is conductively coupled to mesa structure sidewall electrical contacts of the plurality of radiation detectors.

The array of radiation detectors further includes a substrate having a first surface underlying a surface of the first layer. The substrate is selected from a material that is substantially transparent to electromagnetic radiation within the first and the second spectral bands.

The array may further include an antireflection coating that is disposed upon a second surface of the substrate. The second surface is a radiation admitting surface of the array that is opposite the first surface. The array may further include, for each radiation detector, at least one microlens disposed adjacent to the second, radiation admitting surface of the substrate. The microlens focusses incident radiation into at least one of the first layer and the third layer.

A dielectric layer, preferably a layer of wide bandgap semiconductor material, is disposed over surfaces of the at least one mesa structure. In order to avoid diode gating and leakage effects, a layer of high resistivity dielectric material is preferably interposed between the passivation layer and the electrically conductive bus.

BRIEF DESCRIPTION OF THE DRAWINGS

The above set forth and other features of the invention are made more apparent in the ensuing Detailed Description of the Invention, when read in conjunction with the attached Drawings, wherein:

FIG. 1 is a cross-sectional view, not to scale, of a prior art dual-band (two color) IR detector;

FIG. 2 is a cross-sectional view, not to scale, of a two color IR detector of a type having a third mesa, indium bump, and associated metalization for contacting a middle layer that is common to both of the detectors;

DETAILED DESCRIPTION OF THE INVENTION

Figure 4:
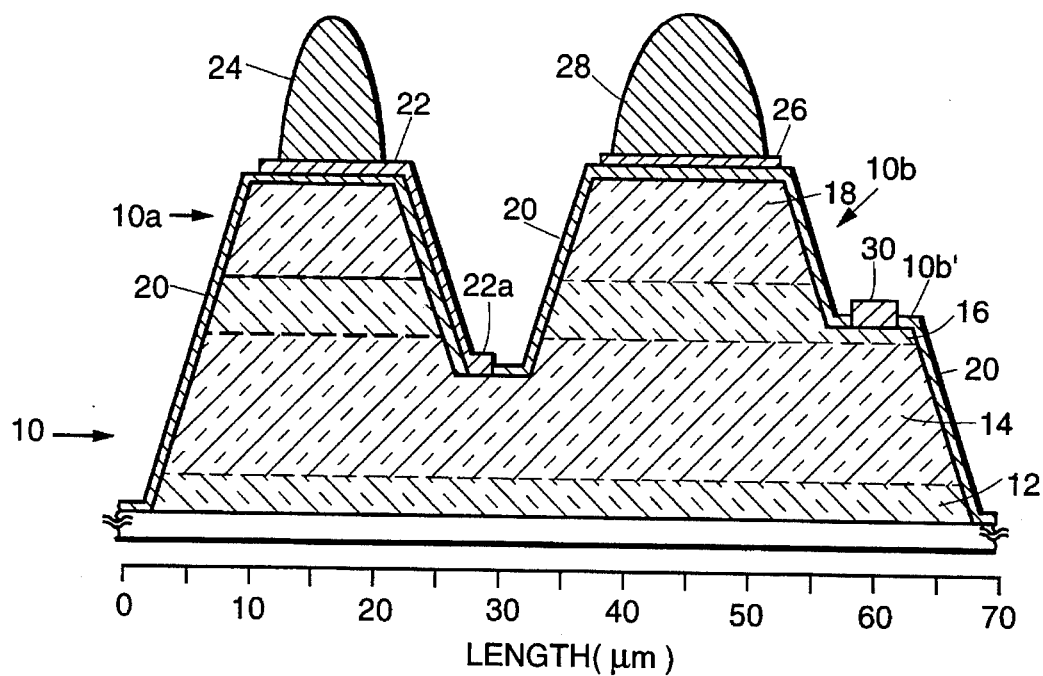
FIG. 4 is a cross-sectional view, not to scale, of the two color IR radiation detector taken along the section line 4—4 of FIG. 3.

The disclosures of the above-referenced commonly assigned U.S. Pat. Nos. 5,113,076 and 5,149,956 are incorporated by reference herein in their entireties.

As employed herein Short Wavelength Infrared (SWIR) radiation is considered to include a spectral region extending from approximately 1000 nanometers (nm) to approximately 3000 nm. Medium Wavelength Infrared (MWIR) radiation is considered to include a spectral region extending from approximately 3000 nm to approximately 8000 nm. Long Wavelength Infrared (LWIR) radiation is considered to include a spectral region extending from approximately 7000 nm to approximately 14000 nm. Very Long Wavelength Infrared (VLWIR) radiation is considered to include a spectral region extending from approximately 12000 nm to approximately 30000 nm. Although the bands overlap to some extent, for the purposes disclosed herein the overlap is not considered to be significant. Also, as employed herein a semiconductor material is considered to exhibit significant responsivity to a given spectral band if the semiconductor material exhibits a maximum or substantially maximum photosensitivity to wavelengths within the given spectral band.

Reference is first made to FIG. 2 for showing a cross-sectional view, not to scale, of an embodiment of a dual-band radiation detector 1. Detector 1 includes a substrate 2 over which is grown a multilayered HgCdTe detector structure. The detector 1 may be grown by Liquid Phase Epitaxy (LPE), Molecular Beam Epitaxy (MBE), Vapor Phase Epitaxy (VPE), or by any process that is suitable for forming high quality layers or films of $Hg_{1-x}Cd_xTe$, where the value of x is selected to set the bandgap energy of the $Hg_{1-x}Cd_xTe$ to provide a desired spectral response for a given layer or film.

By example, suitable LPE growth techniques are described in the following two articles: T. Tung, M. H. Kalisher, A. P. Stevens and P. E. Herning, in: Materials for Infrared Detectors and Sources, Mater. Res. Soc. Symp. Proc., Vol. 90 (Mater. Res. Soc., Pittsburg, Pa., 1987), p. 321; and T. Tung, Infinite-Melt Vertical Liquid-Phase Epitaxy of HgCdTe from Hg Solution: Status and Prospects, J. Crystal Growth 86 (1988), pgs. 161–172.

The multi-layered HgCdTe detector structure is comprised of a first layer 3 which is an n-type MWIR-responsive radiation absorbing layer. Overlying the first layer 3 is a p-type second layer 4. Overlying the second layer 4 is a third layer 5 which is a n-type LWIR-responsive radiation absorbing layer. Layers 3, 4 and 5 are differentiated into three mesa structures 6, 7 and 8.

Mesa structure 6 includes an indium bump 6' for connecting to a corresponding indium bump on a readout integrated circuit (not shown). Indium bump 6' is electrically connected to a metal lead 6" that makes an ohmic connection to the n-type MWIR-responsive layer 3. Mesa structure 7 includes an indium bump 7' for connecting to a corresponding indium bump on the readout integrated circuit. Indium bump 7' is electrically connected to a metal lead 7" that makes an ohmic connection to the p-type middle layer 4. Mesa structure 8 includes an indium bump 8' for connecting to a corresponding indium bump on the readout integrated circuit. Indium bump 8' is electrically connected to the n-type LWIR layer 5.

In operation, IR radiation is incident upon a bottom surface 2a of the substrate 2. Substrate 2 is thus comprised of a material, such as CdZnTe, that is substantially transparent to IR radiation having wavelengths of interest, or MWIR and LWIR in this case. An antireflection coating may be applied to the bottom surface of the substrate 2 to improve efficiency. Suitable reverse bias potentials are applied between the middle layer indium bump 7' and the MWIR layer indium bump 6' and the LWIR layer indium bump 8', enabling IR-induced photocurrents to be read out and subsequently processed by the readout integrated circuit (not shown).

It can be appreciated that the presence of the mesa 7 and the indium bump 7' increases both the complexity and the size requirement for the detector 1. As such, when fabricating an array of detectors a minimum size of the individual detectors (pixels) cannot be reduced beyond what is required to accommodate the three mesas and the three indium bumps.

This invention thus addresses and solves this problem, and enables a reduction in both the complexity and the minimum size of each detector or pixel element of an array of IR-responsive two color detectors.

Figure 3:
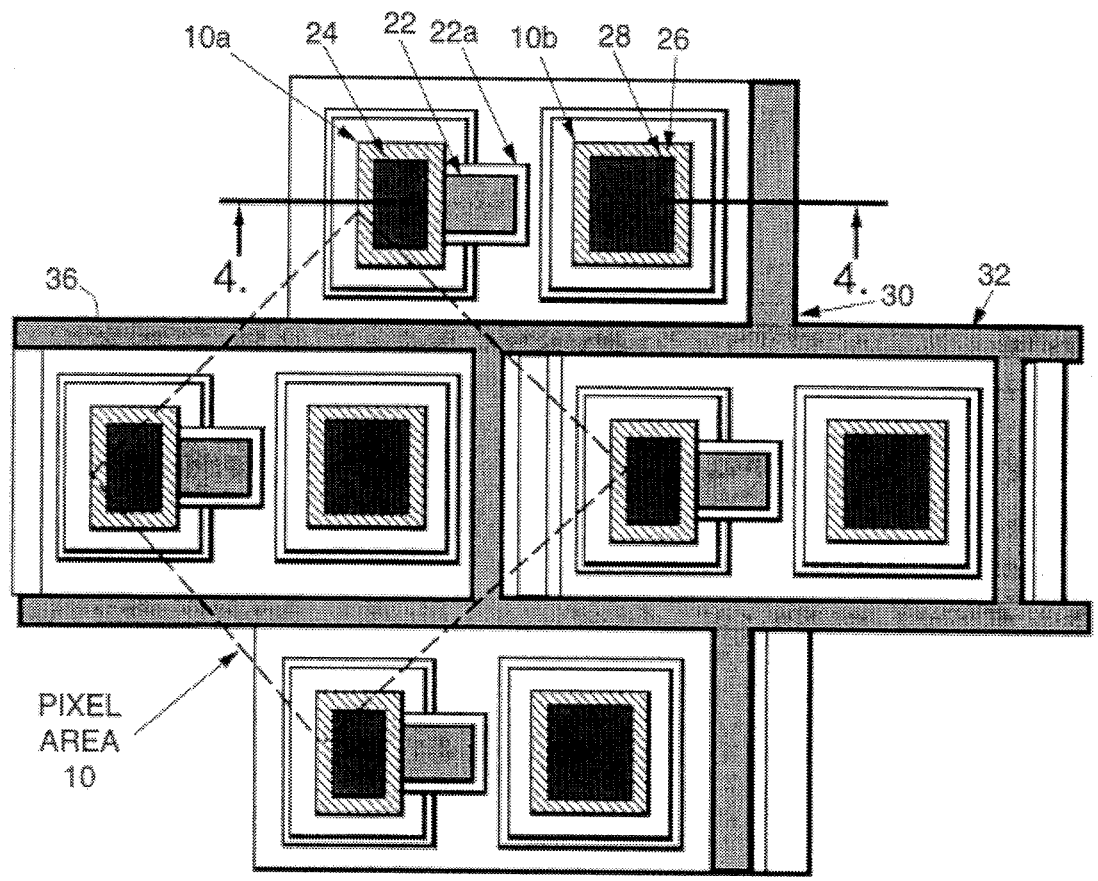
FIG. 3 is an enlarged top view of a portion of an array of two color IR detectors in accordance with a first embodiment of this invention.

Reference is now made to FIGS. 3 and 4 for showing a first embodiment of a two color IR responsive radiation detector array in accordance with this invention. The detector array is comprised of a plurality of photodetector sites each comprised of a radiation detector or pixel 10 having, by example, a 50 micrometer pitch. As is evident from FIG. 3, the cross-sectional view of FIG. 4 is taken diagonally across a single one of the radiation detector pixels 10.

The detector 10 is formed over a transparent substrate 12, e.g., a CdZnTe substrate. Over a surface of the substrate 12 is grown an n-type MWIR responsive radiation absorbing layer 14. Layer 14 has a thickness of approximately 11 micrometers and is doped n-type with, by example, indium at a concentration of approximately $3 \times 10^{15}$ atoms/cm$^3$. Overlying the first layer 14 is a p-type second layer 16. Layer 16 has a thickness of approximately 3.5 micrometers and is doped p-type with, by example, arsenic at a concentration greater than $10^{16}$ atoms/cm$^3$. Overlying the second layer 16 is an n-type LWIR responsive radiation absorbing layer 18. Layer 18 has a thickness of approximately 8.5 micrometers and is doped n-type with, by example, indium at a concentration of approximately $3 \times 10^{15}$ atoms/cm$^3$.

It is pointed out the foregoing layer thicknesses, dopant types, and dopant concentrations are exemplary, and are not to be construed in a limiting sense upon the practice of the teaching of this invention.

In the embodiment of FIGS. 3 and 4 the layers 14, 16 and 18 are differentiated with orthogonally disposed trenches to form a plurality of mesa structures, wherein a single photodetector is comprised of one (FIG. 5) or two (FIGS. 3 and 4) mesa structures, such as the two mesa structures 10a and 10b. The mesa structure 10a has a top surface and downwardly sloping sidewalls that terminate in the substrate 10 and within the MWIR layer 14. The mesa structure 10b also has a top surface and downwardly sloping sidewalls that terminate in the MWIR layer 14 and substrate 10. One sidewall of the mesa structure 10b is preferably formed to have a step 10b' at the level of the p-type layer 16. The step 10b' facilitates access to the common p-layer 16, as will be described below. Overlying exposed surfaces of the mesa structures 10a and 10b is an electrically insulating dielectric layer, preferably a wide-bandgap passivation layer 20, such as a layer of CdTe. The passivation layer 20 beneficially reduces surface states and improves the signal-to-noise ratio of the detector 10. A suitable thickness for the passivation layer 20, when comprised of CdTe, is approximately 5000 Å.

A first contact electrode 22 is electrically coupled to the MWIR layer 14 at contact region 22a and to a first bump 24. The bump 24 is preferably an indium bump, although other suitable metals or metal alloys can be employed. A second contact 26 is electrically coupled to the LWIR layer 18 and to a second, preferably indium, bump 28. The indium bumps 24 and 28 enable the array to be subsequently hybridized with an associated readout integrated circuit, and are cold welded to corresponding indium bumps on a surface of the readout integrated circuit. Techniques for hybridizing radiation detector arrays to readout integrated circuits are known in the art.

In accordance with this invention, a third electrical contact 30 is electrically coupled to the p-type layer 16 upon the mesa sidewall step 10b', and is conductively coupled to a common bus 32 that runs through the entire array of detectors 10. A significant advantage of the middle layer, sidewall contact 30 is that it requires significantly less space than would a separately provided mesa and indium bump (see, for example, the mesa 7 of FIG. 2). The bus 32 may be comprised of a layer of photolithographically defined and sputtered aluminum, and has the general form of a metallic grid that is threaded through the array of detectors 10. The metallic grid or bus 32 is provided with an indium bump (not shown) at a peripheral region of the array for contacting the external readout integrated circuit (not shown).

Exemplary dimensions for the detector 10 of FIGS. 3 and 4 are as follows. The top surface of mesa 10a is 12×16 micrometers and the base of the indium bump 24 is 10×8 micrometers. The MWIR contact metal 22 is 8×16 micrometers and the contact portion 22a is 10×18 micrometers. The top surface of mesa 10b is 16×16 micrometers and the base of the indium bump 28 is 12×12 micrometers. The LWIR contact metal 26 is 8×8 micrometers. An etched aperture made through the passivation layer 20 for the middle layer contact 30 is 3×25 micrometers, and the width of the common bus 32 is 5 micrometers.

Figure 5:
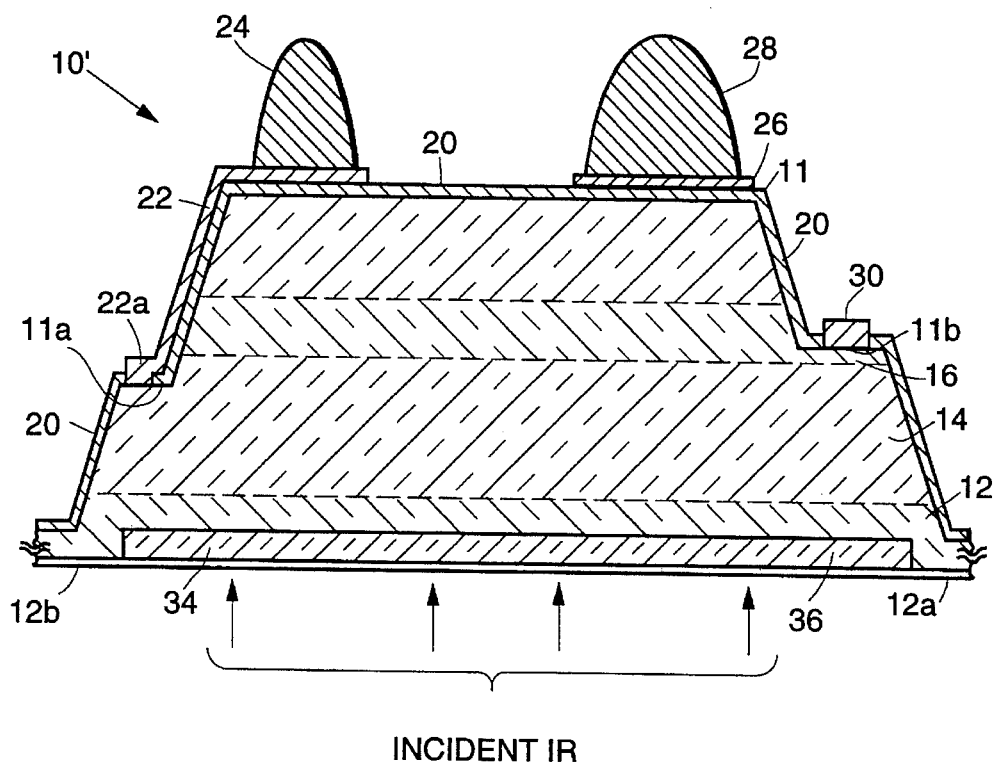
FIG. 5 is a cross-sectional view, not to scale, of a second embodiment of a two-color IR detector in accordance with this invention.

FIG. 5 illustrates in cross-section a second embodiment of a detector 10' wherein a single mesa 11 is employed to support the indium bumps 24 and 28. In this case the mesa 11 has a first sidewall step 11a for providing the contact 22a to the MWIR layer 14 and a second sidewall step 11b for providing the common contact 30 to the p-type layer 16.

FIG. 5 also illustrates the use of a microlens 34 for focussing or concentrating incident IR radiation into at least the LWIR-absorbing layer 18. Preferably, the microlens 34 also provides some focussing of the MWIR radiation into the layer 14. The microlens 34 may be a binary diffractive type and can be fabricated within or upon the radiation receiving surface 12a of the substrate 12, or may be fabricated within or upon a separate transparent substrate that is subsequently disposed over the radiation receiving surface 12a. The microlens 34 may also be used with the detector 10 of FIGS. 3 and 4. Techniques for specifying and fabricating such microlenses are known in the art. By example, reference may be had to an article entitled "Binary Optics" by W. B. Veldkamp et al., Scientific American, 5/92, pgs. 92–97; and to Report No SD-TR-87-54 (AD-A188 705), "Optical Technique for Increasing Fill Factor of Mosaic Arrays", W. A. Garber et al., prepared for the Space Division, Air Force Systems Command, and dated 10 Nov. 1987. The use of the microlens 34, in combination with an antireflection coating 12b, enables a significant portion of the incident MWIR and LWIR radiation to be converted to detectable signal charge.

In operation, the LWIR photodetector comprised of a first p-n photodiode (layers 16 and 18) and the MWIR photodetector comprised of a second p-n photodiode (layers 16 and 14) are preferably operated simultaneously to read out the LWIR and MWIR photoinduced charge carriers. This is accomplished by selectively applying reverse bias potentials across the p-n junctions with the associated readout integrated circuit, and then reading out the charge signal. It is noted that the charge signals can be readout sequentially, as opposed to simultaneously, if this mode of operation is desirable.

Figure 6:
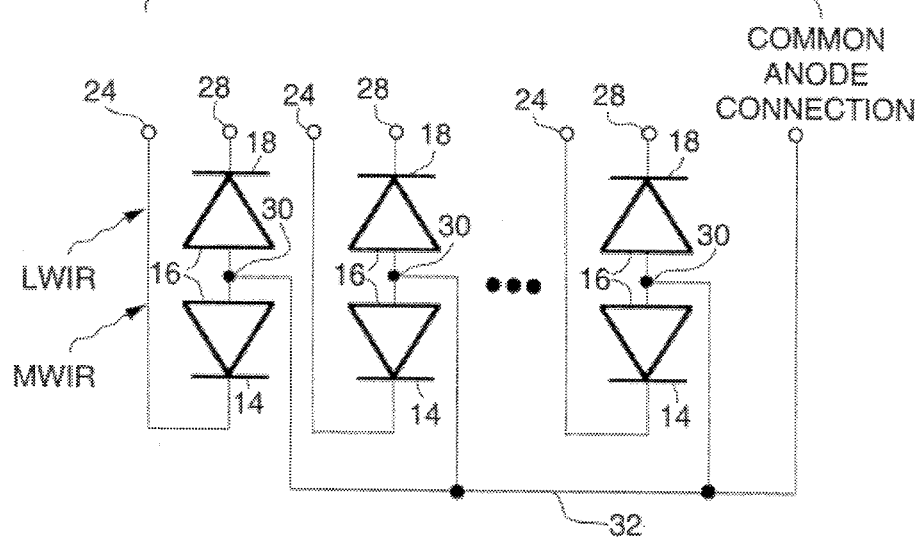
FIG. 6 is schematic diagram illustrating an array of photodetectors in accordance with the teachings of this invention.

As is seen in FIG. 6, the array of detectors 10 can be viewed electrically as an array of back-to-back photodiodes having a common anode (the p-type common layer), wherein all of the anodes are electrically bussed together in common by the common grid metalization or bus 32, and wherein the cathodes are all separately contacted through the indium bumps 24 and 28 from the readout integrated circuit.

One area of possible concern in operating the detectors of FIGS. 3–5 is that the common middle layer grid metalization or bus 32 could degrade the MWIR junction by a diode gating effect as it runs over the edge of diode mesa. This effect would be more pronounced with a dielectric material such as $SiO_2$. As such, the use of a wide bandgap semiconductor passivation material (e.g., CdTe) is preferred for the passivation layer 20. To even further inhibit any gating effect and/or electrical leakage through the passivation layer 20, it is preferred to apply an electrically insulating layer 36 of dielectric material, such as $SiO_2$, between the surface of the passivation layer 20 and the metal grid 32.

Although described in the context of a MWIR-LWIR radiation responsive device, it should be realized that the detector 10 can be constructed to be responsive to other combinations of wavelength bands, such as SWIR-MWIR, SWIR-LWIR, or MWIR-VLWIR. The arrangement of the radiation absorbing layers in these alternate embodiments is such that the incident radiation first encounters the wider bandgap semiconductor material. Furthermore, in these alternate embodiments the material of the substrate 12 is selected so as to be substantially transparent to the wavelength bands of interest. Also, the substrate 12 can be comprised of a material other than a Group II–VI material (CdZnTe). For example, the substrate 12 can be comprised of a Group IV material, such as Si, or a Group III–V material, such as GaAs. It also within the scope of this invention to provide a p-n-p layer arrangement within the at least one mesa structure, as opposed to the n-p-n layer arrangement that is shown in FIGS. 4 and 5. For this case the schematic diagram of FIG. 6 would be redrawn accordingly to show the back-to-back photodetectors as having their cathodes connected in common to the grid metalization or bus 32, and their anodes separately contacted through the indium bumps 24 and 28.

Furthermore, it should be realized that the various material types, dimensions, and thicknesses are exemplary, and should not be read in a limiting sense upon the practice of the teaching of this invention.

Thus, while the invention has been particularly shown and described with respect to preferred embodiments thereof, it will be understood by those skilled in the art that changes in form and details may be made therein without departing from the scope and spirit of the invention.

What is claimed is:

1. An array comprised of a plurality of radiation detectors, individual ones of said radiation detectors comprising:
    a first layer comprised of Group II–VI semiconductor material, said first layer having a first type of electrical conductivity and a bandgap selected for absorbing radiation within a first spectral band;
    a second layer overlying said first layer, said second layer being comprised of Group II–VI semiconductor material, said second layer having a second type of electrical conductivity that is opposite the first type of electrical conductivity; and
    a third layer overlying said second layer, said third layer being comprised of Group II–VI semiconductor material, said third layer having the first type of electrical conductivity and a bandgap selected for absorbing radiation within a second spectral band;
    wherein said first, second and third layers are contained within at least one mesa structure supporting on a top surface thereof a first electrical contact to said first layer and a second electrical contact to said third layer, said at least one mesa structure further supporting on a sidewall thereof an electrical contact to said second layer, said sidewall electrical contact being coupled to an electrically conductive bus that is conductively coupled to mesa structure sidewall electrical contacts of said plurality of radiation detectors.

2. An array of radiation detectors as set forth in claim 1, wherein said first electrical contact includes a first indium bump and wherein said second electrical contact includes a second indium bump.

3. An array of radiation detectors as set forth in claim 1, wherein said first and second spectral bands are selected from the group consisting essentially of SWIR, MWIR, LWIR, and VLWIR.

4. An array of radiation detectors as set forth in claim 1, and further comprising a substrate having a first surface underlying a surface of said first layer, said substrate being selected from a material that is substantially transparent to electromagnetic radiation within said first and said second spectral bands; and further comprising an antireflection coating that is disposed upon a second surface of said substrate, said second surface being a radiation admitting surface of said array that is opposite said first surface.

5. An array of radiation detectors as set forth in claim 1, and further comprising a substrate having a first surface underlying a surface of said first layer, said substrate being selected from a material that is substantially transparent to electromagnetic radiation within said first and said second spectral bands; and further comprising lens means disposed adjacent to a second surface of said substrate, said second surface being a radiation admitting surface of said array that is opposite said first surface, said lens means focussing incident radiation into at least one of said first layer and said third layer.

6. An array of radiation detectors as set forth in claim 1, and further comprising a dielectric layer overlying surfaces of said at least one mesa structure.

7. An array of radiation detectors as set forth in claim 6, wherein said dielectric layer is comprised of a wide bandgap semiconductor material.

8. An array of radiation detectors as set forth in claim 7, and further comprising a layer of high resistivity dielectric material that is interposed between said dielectric layer and said electrically conductive bus.

9. A method for fabricating an array of photodetector sites, individual ones of the photodetector sites being responsive to electromagnetic radiation having wavelengths within at least two spectral bands of wavelengths, comprising the steps of:
    providing a substrate;
    forming a first layer comprised of Group II–VI semiconductor material upon a first surface of the substrate, the first layer having a first type of electrical conductivity and a bandgap selected for absorbing radiation within a first spectral band;
    forming a second layer upon the first layer, the second layer being comprised of Group II–VI semiconductor material having a second type of electrical conductivity that is opposite the first type of electrical conductivity;
    forming a third layer upon the second layer, the third layer being comprised of Group II–VI semiconductor material having the first type of electrical conductivity and a bandgap selected for absorbing radiation within a second spectral band;
    forming a plurality of orthogonally disposed trenches through the third, second and first layers for defining a plurality of mesa structures, individual ones of said mesa structures having a top surface and sloping sidewall surfaces, wherein a given photodetector site of the array is comprised of at least one mesa structure;

passivating exposed surfaces of said plurality of mesa structures with a passivation layer;

for said at least one mesa structure of each of the photodetector sites, applying first and second electrical contacts over the top surface of the mesa structure for conductively coupling to the first and third layers within the mesa structure, and applying a third electrical contact to a sidewall of the mesa structure for conductively coupling through the passivation layer to the second layer; and applying an electrically conductive bus over the passivation layer for conductively coupling to the third electrical contacts of individual ones of the photodetector sites for conductively coupling together in common the second layers of a plurality of the photodetector sites.

10. A method as set forth in claim 9, wherein the first and second spectral bands are selected from the group consisting essentially of SWIR, MWIR, LWIR, and VLWIR.

11. A method as set forth in claim 9 wherein the substrate is selected from a material that is substantially transparent to electromagnetic radiation within the first and the second spectral bands, and further comprising a step of forming an antireflection coating on a second surface of the substrate that is opposite the first surface.

12. A method as set forth in claim 9 wherein the substrate is selected from a material that is substantially transparent to electromagnetic radiation within the first and the second spectral bands, and further comprising a step of forming, for each photodetector site, at least one lens means upon, within or over a second surface of the substrate that is opposite the first surface for focussing incident radiation into at least one of the first and third layers.

13. A method as set forth in claim 9, wherein the step of passivating includes a step of depositing a layer of a wide bandgap semiconductor material.

14. A method as set forth in claim 13, wherein the step of applying an electrically conductive bus includes an initial step of applying a layer of high resistivity dielectric material to the passivation layer, and wherein the step of applying the electrically conductive bus applies the bus over the layer of high resistivity dielectric material.

15. An array comprised of a plurality of infrared (IR) radiation-responsive photodetectors, individual ones of said photodetectors being simultaneously responsive to IR radiation within first and second spectral bands selected from a group that includes SWIR, MWIR, LWIR, and VLWIR, comprising:

a substrate having a first surface and a second surface, said second surface being a radiation admitting surface of said array that is opposite said first surface, said substrate being selected from a material that is substantially transparent to IR radiation within said first and said second spectral bands;

a first layer comprised of Group II–VI semiconductor material, said first layer overlying said first surface of said substrate and having a first type of electrical conductivity and a bandgap selected for absorbing radiation within said first spectral band;

a second layer overlying said first layer, said second layer being comprised of Group II–VI semiconductor material, said second layer having a second type of electrical conductivity that is opposite the first type of electrical conductivity; and a third layer overlying said second layer, said third layer being comprised of Group II–VI semiconductor material, said third layer having the first type of electrical conductivity and a bandgap selected for absorbing radiation within said second spectral band;

wherein said first, second and third layers are contained within at least one mesa structure supporting on a top surface thereof a first bump that is conductively coupled to said first layer and a second bump that is conductively coupled to said third layer, said at least one mesa structure further supporting on a sidewall thereof an electrical contact to said second layer, said sidewall electrical contact being coupled to an electrically conductive bus that is conductively coupled in common to mesa structure sidewall electrical contacts of said plurality of IR radiation-responsive photodetectors.

16. An array of IR radiation-responsive photodetectors as set forth in claim 15, wherein said first and second bumps are comprised of indium.

17. An array of IR radiation-responsive photodetectors as set forth in claim 15, and further comprising an antireflection coating that is disposed upon said second surface of said substrate.

18. An array of IR radiation-responsive photodetectors as set forth in claim 15, and further comprising lens means disposed adjacent to said second surface of said substrate for focussing incident IR radiation into at least one of said first layer and said third layer.

19. An array of IR radiation-responsive photodetectors as set forth in claim 15, and further comprising:

a passivation layer overlying surfaces of said at least one mesa structure, said passivation layer being comprised of a wide bandgap semiconductor material; and a layer of high resistivity dielectric material that is interposed between said passivation layer and said electrically conductive bus.

* * * * *